(12) United States Patent
Antonischki

(10) Patent No.: US 6,751,762 B2
(45) Date of Patent: Jun. 15, 2004

(54) SYSTEMS AND METHODS FOR TESTING A MEMORY

(75) Inventor: Georg Antonischki, Durham, NC (US)

(73) Assignee: Infineon Technologies AG, Munich (DE)

(*) Notice: Subject to any disclaimer, the term of this patent is extended or adjusted under 35 U.S.C. 154(b) by 457 days.

(21) Appl. No.: 09/817,370

(22) Filed: Mar. 27, 2001

(65) Prior Publication Data

US 2003/0212933 A1 Nov. 13, 2003

(51) Int. Cl.[7] .............................................. G11C 29/00
(52) U.S. Cl. ....................... 714/718; 714/733; 365/201
(58) Field of Search .............................. 714/718, 733; 365/201

(56) References Cited

U.S. PATENT DOCUMENTS

| 5,553,082 A | 9/1996 | Connor et al. | ............. 714/733 |
| 5,859,804 A * | 1/1999 | Hedberg et al. | ............ 365/201 |
| 5,912,901 A * | 6/1999 | Adams et al. | ............. 714/733 |
| 5,954,830 A * | 9/1999 | Ternullo, Jr. | ................ 714/718 |
| 6,003,150 A | 12/1999 | Stroud et al. | ............... 714/725 |
| 6,304,989 B1 * | 10/2001 | Kraus et al. | ................ 714/733 |

* cited by examiner

Primary Examiner—Albert Decady
Assistant Examiner—Dipakkumar Gandhi
(74) Attorney, Agent, or Firm—Slater & Matsil, L.L.P.

(57) ABSTRACT

Systems and methods for testing a memory array in an integrated circuit. The method provides a favorable tradeoff between test time and quality of test results, by compressing data in a time direction, but not compressing results from multiple primary data lines corresponding to respective I/O pads.

27 Claims, 5 Drawing Sheets

SYSTEMS AND METHODS FOR TESTING A MEMORY

BACKGROUND OF THE INVENTION

1. Field of Invention

The present invention relates generally to systems and methods for testing a memory and, more particularly, to systems and methods for testing a memory by compressing in a time direction using a built-in self tester (BIST).

2. Description of the Related Art

Typically, compression of data using the built-in self tester (BIST) and other techniques is by I/O compression, because integrated circuits designs require testing following their development, for purposes of detecting faults.

A typical method of testing, referred to as a built-in self testing (BIST) has been used with components such as programmable logic arrays (PLAs). Using this approach, the logic required to test for the circuit, and the logic required before analysis of the circuit relative to these tests, are obtained with hardware placed in the same system as the circuit under test. Consequently, the circuit is capable of testing itself and reporting to its environment whether it is a working circuit or not. The components tested include cards, wafers, or an integrated circuit chip, which may include a memory.

When testing components, on-chip testing is best, and it is feasible to test all storage points in the logical "0" and "1" states.

When automated built-in self testing (ABIST) of memories is used, an interface to the memory through input and output boundry latches is required. These latches function as logic gate storage elements. Each input and output has a latch through which ABIST test data is supplied and captured for compression. Data sent through the input latches is "muxed" i.e., multiplexed with functional data and output to the memory input. The mux selection between the test data and the functional data is controlled by a tester machine.

The latch inputs are provided off of the memory outputs to observe the data i.e. provided to the testing structure in parallel to other logic circuitry on the chip. Each of the latches feeds directly to the compression circuits. The data is then compared to expected data and compressed to generate a single fail signature, whereupon the single fail signature is output off-chip for analysis and evaluation.

U.S. Pat. No. 5,954,830 disclose a memory test apparatus for use with memory having a plurality of outputs, including a built-in, self-testing (BIST) test state machine having a plurality of address outputs; a plurality of multiplexers controlled by the address outputs of the test state machines; and means for testing the plurality of outputs of the memory based on the address outputs of the test state machine, wherein the plurality of outputs of the memory are input to the plurality of multiplexers and a number of outputs tested simultaneously is less than a total number of outputs of the memory.

An array of built-in self test (ABIST)is disclosed in U.S. Pat. No. 5,859,804. In this ABIST, a system control circuit provides per address read/write commands to an array A, controls address stepping, influences data pattern generation to the array and to a data compression circuit, and controls results logging in the two dimension failed address register. During the reading operation, expected data from a data pattern generator is applied to the data compression circuit for data output evaluation.

U.S. Pat. No. 5,553,082 disclose a built-in self-test (BIST) for comparator logic circuitry at the output of a memory array output. Output from compression/compare circuit 28 is a real-time "pass/fail" signal which may be monitored for detection of a memory array failure.

A method for testing field programmable gate arrays (FPGA's) is disclosed in U.S. Pat. No. 6,003,150. The method is for diagnostic testing of field programmable gate arrays (FPGA's). In particular, the testing method is adapted to perform output response analysis by means of direct comparison.

U.S. Pat. No. 5,912,901 disclose a built-in self-test apparatus and method for testing integrated circuits which capture failure information for a selected failure. The BIST apparatus comprises a clock generator, which generates at least a first clock signal, and a built-in self-tester, which applies predetermined input data patterns to the integrated circuit in response to the first clock signal.

SUMMARY OF THE INVENTION

It is an object of the present invention to provide improved systems and methods of testing a memory.

To achieve this and other objects of the present invention, there is a method of testing a memory in an integrated circuit (IC) The method comprises the steps, performed in the integrated circuit, of sending a first value to a plurality of locations; initializing a state; subsequently, performing the following steps multiple times: changing a column address associated with a data line; and reading from the data line, comparing the read value to the first value, and setting the state to a value depending on the results of the comparing and the current value of the state.

According to yet another aspect of the present invention, an integrated circuit (IC) comprises a plurality of addressable locations; a data line selectively responsive to one of multiple ones of the addressable locations; a first element that stores a state; first circuitry, activatable multiple times after initialization of the element, that reads from the data line, compares the read value to a first value, and selectively modifies the state to a value depending on the results of the comparing and the current value of the state.

According to yet another aspect of the present invention, a system comprises means for sending a first value to a plurality of locations; means for initializing a state; means for changing a column address associated with a data line; and means for reading from the data line, comparing the read value to the first value, and setting the state to a value depending on the results of the comparing and the current value of the state.

BRIEF DESCRIPTION OF THE DRAWINGS

The foregoing and other objects and advantages of the invention will be better appreciated from the following detailed description of preferred embodiments of the invention with reference to the drawings.

DETAILED DESCRIPTION OF PREFERRED EMBODIMENTS OF THE INVENTION

Figure 1:
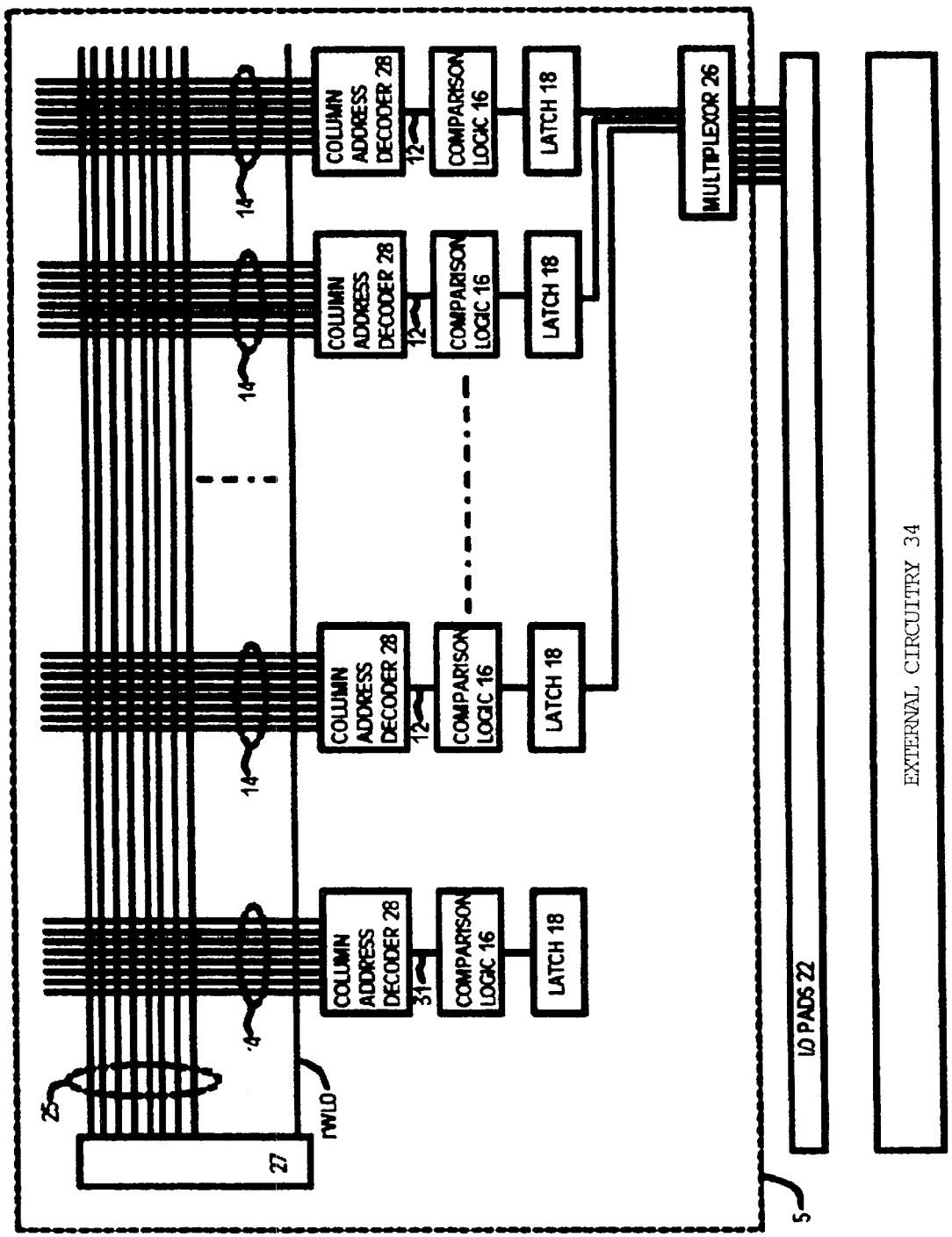
FIG. 1 shows a testing system in accordance with a first preferred embodiment of the present invention.

FIG. 1 shows system 1 including an integrated circuit (IC) 5 in accordance with a first preferred embodiment of the present invention. IC 5 is an 256×1 megabit memory array. IC 5 includes 256 primary data lines (PDLs) 12. When IC 5 is free of defects, each PDL 12 is connected to receive data from, or send data to, a respective one of 256 input/output (I/O) pads 22. Each PDL 12 is connected to a respective column address decode module 28, which receives data from a respective set of 8 bit lines 14.

Each bit line 14, of each column address decode module 28, is connected to the current path of 512 transistors in 512 respective storage locations. The gate of each transistor is connected to a respective one of 512 word lines 25. Row address decode module 27 receives a row address and activates one of the word lines 25. Column address decode module 28 receives a column address to multiplex one of the 8 bit lines 14 onto a primary data line 12.

External Bist 34 initializes IC 5 by writing a value to each memory location, via internal connection 22. Subsequently, system 1 attempts to reach each memory location, and process the read locations through their respective primary data line and comparison logic 16. Subsequently, the results of the comparison are clocked into respective 256 bit latches 18.

Figure 2:
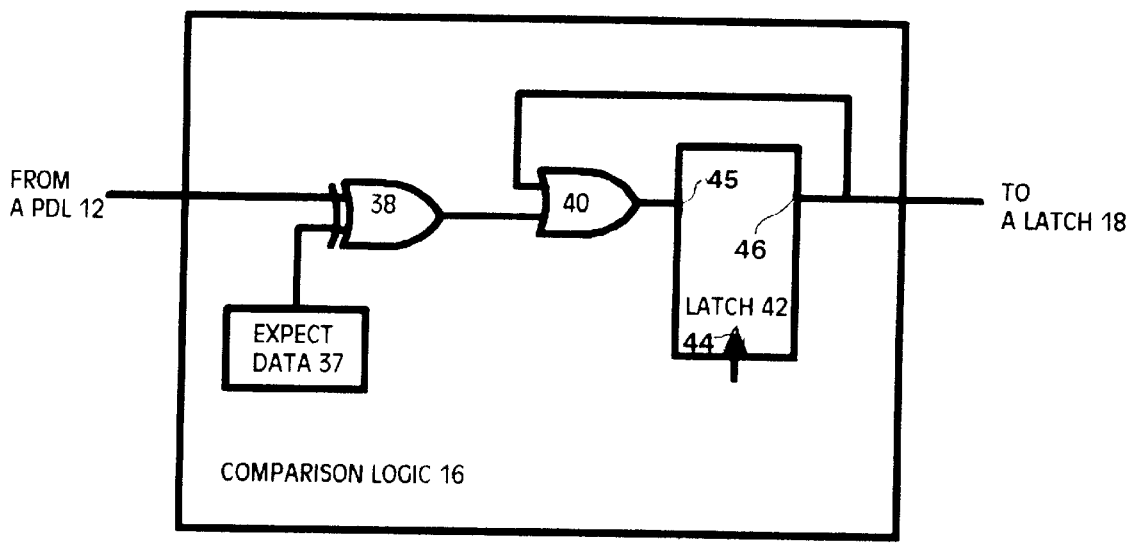
FIG. 2 is a diagram emphasizing a portion of modules shown in FIG. 1.

FIG. 2 shows a comparison logic module 16 in more detail. Exclusive OR gate 38 compares a read value, from a primary data line 12, with an expected result stored in latch 37. For example, if external testor initializes IC 5 with all zeros, external testor 34 also writes a zero to expect result latch 37. A failure results in a 1 output from gate 38, which is ORed with previous comparison results by OR gate 40. Previous comparison results are stored in latch 42.

Thus, there are two different types of cycles. A first type may be deemed a memory cycle. Within each memory cycle, one element of test data is generated. Module 16 stores the results in a latch by ORing the latch and the result, assuming that a FAIL is a "1". Thus, if any memory cycle hits a failing cell, latch 42 will store a "1".

A group of memory cycles may be deemed a latch cycle. After completing the latch cycle the data is moved into secondary latches 18. The following memory cycles are now available to read out latches 18 to the external I/O pads 22. IC 5 reads out a set of data per memory cycle. Furthermore, because of multiplexor 26, IC 5 reads out the set using only 8 I/O pads, resulting in a stream of 32 test digits per I/O pad. This stream of digits may be deemed a burst.

Thus, IC 5 is a type of eDRAM array apparatus for compressing test data using built-in self test (BIST) on a memory tester in time direction.

The information on the I/Os is not combined, thereby allowing repair capability of the redundant elements.

External circuitry 34 may be a general purpose, programmable, tester, or may be hardware specialized for testing IC 5. In this Patent Application, the word circuitry encompasses dedicated hardware, and/or programmable hardware, such as a CPU or reconfigurable logic array, in combination with programming data, such as sequentially fetched CPU instructions or programming data for a reconfigurable array.

If external circuitry 34 detects a failing row, external circuitry 34 infers that a word line (WL) is broken. For example, if WL 123 is broken (or at least one cell on WL 123) circuitry 34 will fuse in redundant rWL0 (FIG. 1).

In the first preferred embodiment, IC 5 does not compress row test data by ORing the test data of several adjacent rows.

If IC 5 detects a failing cell on (BL3)—or column address 3 on I/O or PDL 0—system 1 repairs with a whole PDL and all 8 adjacent BL. System 1 fuses in redundant primary data line 31 (rPDL0). Thus, in the first preferred embodiment, the redundancy calculation need not reveal whether the broken cell is on BL0 or BL1 or . . . or BL7. This may be deemed the compressible area.

Figure 3:
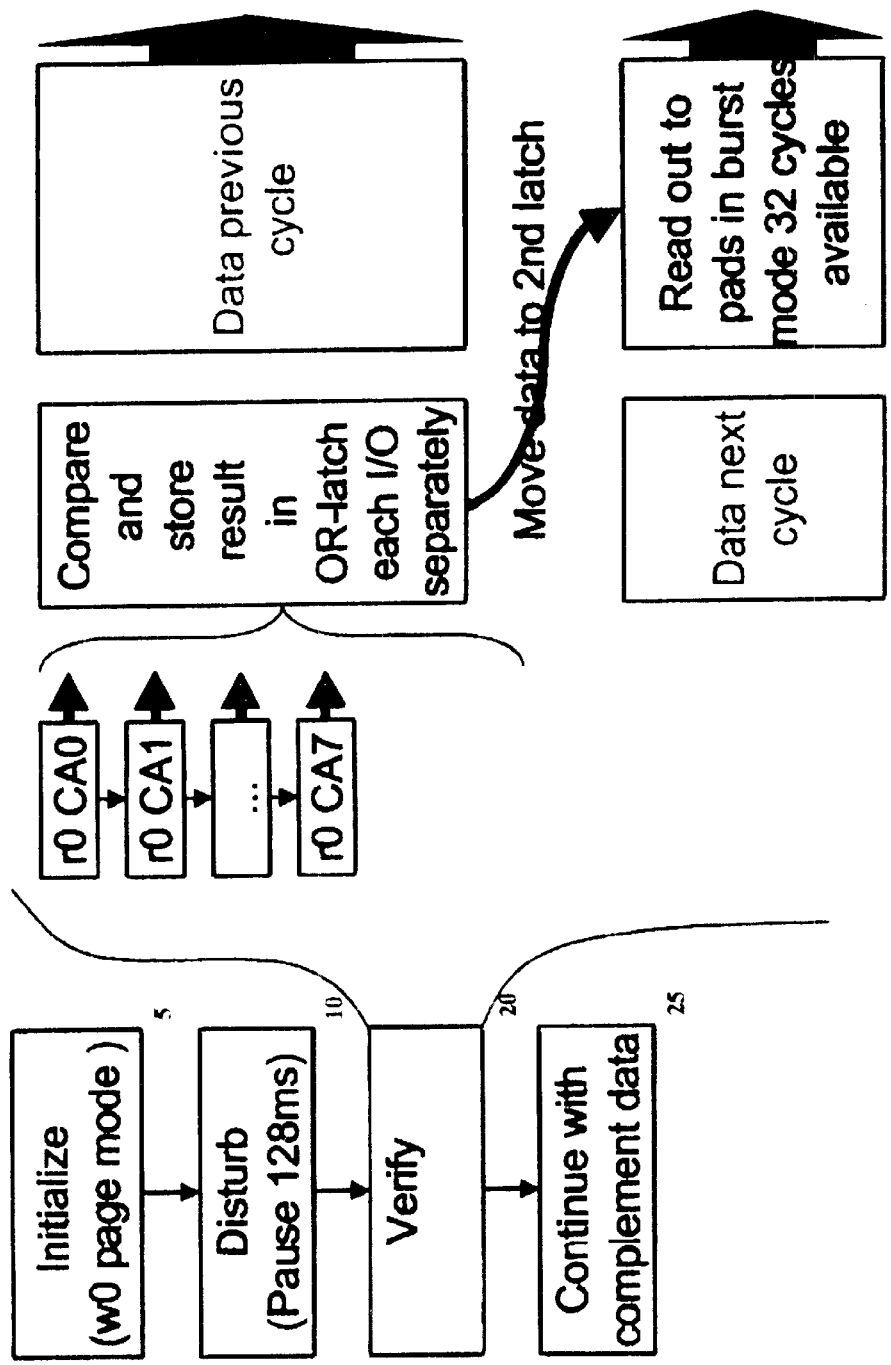
FIG. 3 is a flow chart showing a process performed by the first preferred system.

FIG. 3 is a combination flow chart and data flow diagram showing a process performed in system 1. External circuitry 34 initializes IC 5 by writing 0 to each cell. (step 5). Step 5 also writes 0 to expect data register 37 in each logic module 16.

Circuitry 34 waits for 128 milliseconds. (step 10). More generally, the term "disturb" in block 10 symbolizes an event with the potential for degrading the quality of the data in the cells. A simple way is just to wait, to degrade data. There are other ways to degrade data. For example, one may toggle a WL a thousand times or so.

Circuitry 34 then sends signals to IC 5, to cause IC 5 to verify the contents of the initialized cells, by reading from the initialized cells and comparing the read contents to the expect value of 0. (step 20). More specifically, for each row address, system 1 iterates 8 times, with one iteration for each of column addresses 0–7. Each iteration causes IC 5 to set the column address, send data from each PDL 12 to its respective logic module 16, and then toggle clock input 44 of latch 42. Toggling clock input 44 causes latch 42 to store the data value currently present on data input 45 and transfer the stored data to latch output 46. Every 8 iterations, IC 5 toggles the clock input of secondary latches 18.

As represented in step 25, system 1 continues the process with compliment data. More specifically, external circuitry 34 reinitializes IC 5 by writing 1 to each cell. Step 5 also writes 1 to expect data register 37 in each logic module 16. Circuitry 34 waits for 128 milliseconds. Circuitry 34 then sends signals to IC 5, to cause IC 5 to verify the contents of the initialized cells, by reading from the initialized cells and comparing the read contents to the expect value of 1. More specifically, for each row address, system 1 iterates 8 times, with one iteration for each of column addresses 0–7. Each iteration causes IC 5 to set the column address, send data from each PDL 12 to its respective logic module 16, and then toggle clock input 44 of latch 42. Every 8 iterations with this complement data, IC 5 toggles the clock input of secondary latches 18.

In summary, each latch 42 in each of the 256 modules 16 is essentially a type of state to begin a test cycle, circuitry on IC 5 initializes each latch 42 to zero. For each PDL 12, IC 5 increments a column address, reads from the PDL 12 to perform a comparison with exclusive OR gate 38 and sets latch 42 responsive to an output of gate 38. External circuitry 34 then conditionally repairs IC 5 depending on the pattern of states read out via multiplexor 26 and I/O pads 22 each associated with a respective PDL 12. In other words, during a testing cycle in which system 1 increments the column address and performs comparison, and storage with gate 38 and latch 42, IC 5 sends previously recorded results from latch 42 off of IC 5.

While IC 5 compiles one set of data in latches 42, IC 5 reads out data from the previous latch cycle stored in latches 18. Because of multiplexor 26, the number of I/O pads used to read the latch 42 results is only 8, though there are 256 results, one for each of the 256 PDLs.

Thus, the eDRAM built-in self tester (BIST) of IC 5 detects faults efficiently, utilizing less I/Os, in a more "lifelike" test environment, with more information for analysis.

IC 5 may include an internal redundancy calculator, or may send all test data to I/O pads 22 to have the redundancy calculated in external circuitry 34.

Figure 4:
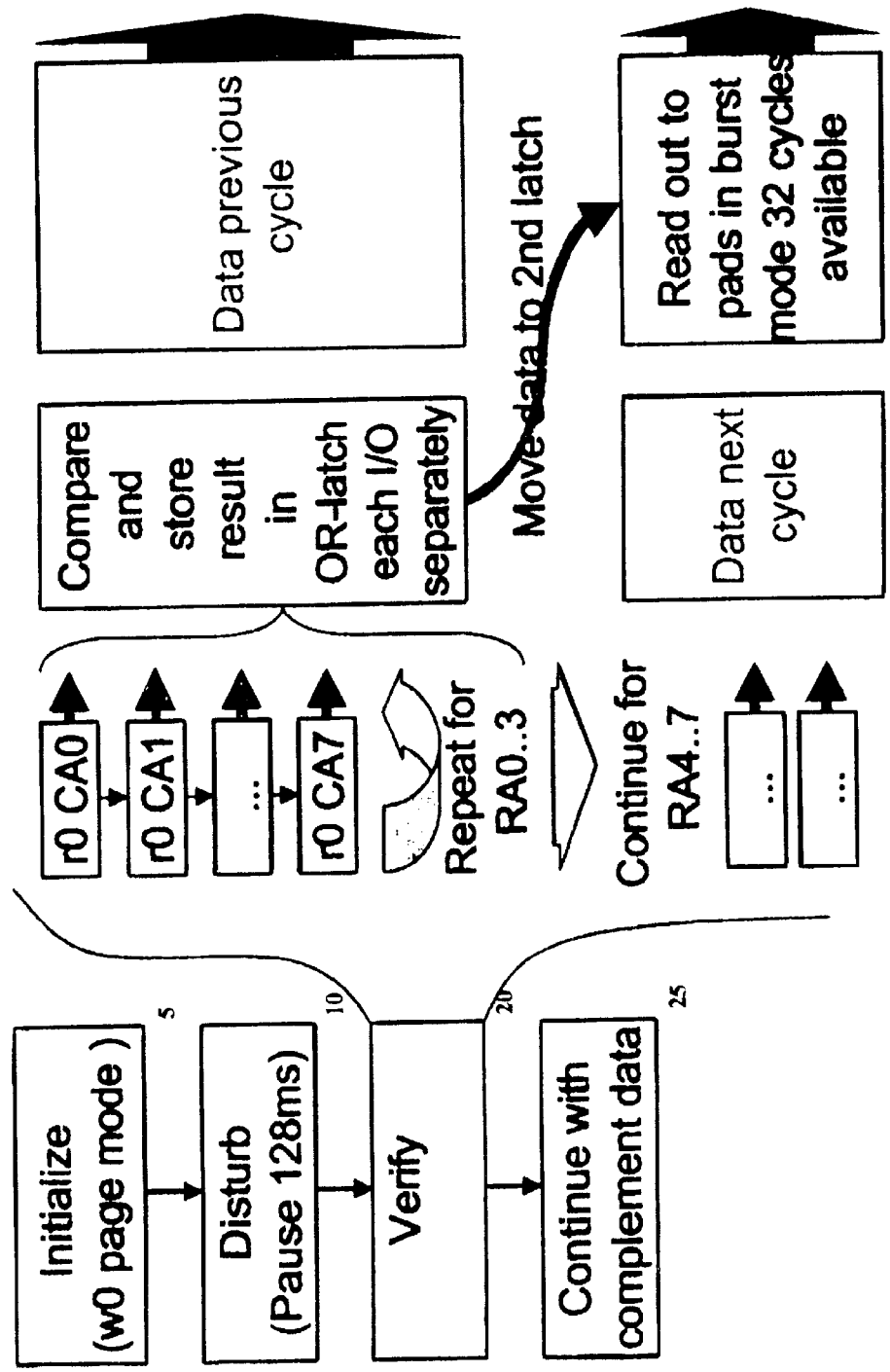
FIG. 4 is a flow chart showing a process performed by system in accordance with a second embodiment of the present invention.

FIG. 4 depicts compression in both the column and row directions in accordance with a second preferred embodiment of the present invention. External circuitry 34 initializes IC 5 by writing 0 to each cell. (step 5). Step 5 also writes 0 to expect data register 37 in each logic module 16.

Circuitry 34 waits for 128 milliseconds. (step 10).

Circuitry 34 then sends signals to IC 5, to cause IC 5 to verify the contents of the initialized cells, by reading from the initialized cells and comparing the read contents to the expect value of 0. (step 20). More specifically, for each clock input cycle of secondary latches 18, system 1 iterates 32 times, with one iteration for each combination of column addresses 0–7 and 4 consecutive row addresses. Each iteration causes IC 5 to set the column address and row address, send data from each PDL 12 to its respective logic module 16, and then toggle clock input 44 of latch 42. Every 32 iterations, IC 5 toggles the clock input of secondary latches 18.

As represented in step 25, system 1 continues the process with compliment data. More specifically, external circuitry 34 reinitializes IC 5 by writing 1 to each cell. Step 5 also writes 1 to expect data register 37 in each logic module 16. Circuitry 34 waits for 128 milliseconds. Circuitry 34 then sends signals to IC 5, to cause IC 5 to verify the contents of the initialized cells, by reading from the initialized cells and comparing the read contents to the expect value of 1. More specifically, for each clock input cycle of secondary latches 18, system 1 iterates 32 times, with one iteration for each combination of column addresses 0–7 and 4 consecutive row addresses. Each iteration causes IC 5 to set the column address and row address, send data from each PDL 12 to its respective logic module 16, and then toggle clock input 44 of latch 42. Every 32 iterations with this complement data, IC 5 toggles the clock input of secondary latches 18.

The second preferred embodiment, depicted in FIG. 4, effects a repair by replacing four adjacent WLs with another module of four redundant rWLs.

Figure 5:
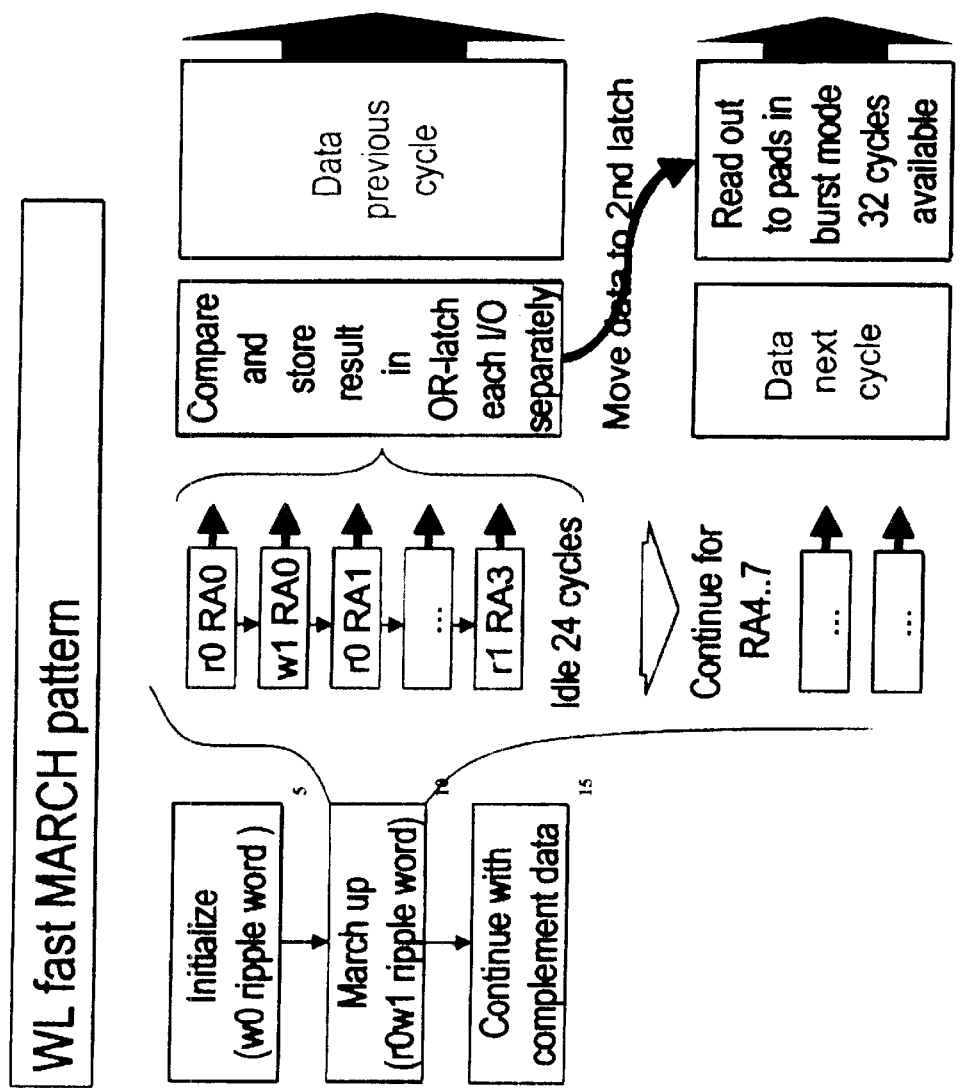
FIG. 5 is a flow chart showing a process performed by a system in accordance with a third preferred embodiment of the present invention.

FIG. 5 illustrates a word line fast MARCH pattern test process in accordance with a third preferred embodiment of the present invention. External circuitry 34 initializes IC 5 by writing 0 to each cell. (step 5).

Circuitry 34 then sends signals to IC 5, to cause IC 5 to verify the contents of the initialized cells, by reading from the initialized cells, comparing the read contents to the expect value, and writes a 1. (step 10). More specifically, for each clock input cycle of secondary latches 18, system 1 iterates 8 times, with one iteration for each combination of 0–1 and 4 consecutive row addresses. Each iteration causes IC 5 to set the column address and row address, send data from each PDL 12 to its respective logic module 16, and then toggle clock input 44 of latch 42. Every 8 iterations, IC 5 toggles the clock input of secondary latches 18.

As represented in step 15, system 1 continues the march pattern process with compliment data.

In summary, the exemplary embodiments of the invention provide an eDRAM built-in self testing (BIST) scheme for detecting faults in a circuit, utilizing a combination of BIST and through-the-pad-testing, that calculates addresses, calculates commands, and compares data, so that, through-the-pad, all necessary BIST data is given through I/O, redundancy is provided on a dedicated tester and provides extraction of data for analysis on the tester.

Thus, the preferred systems allow a trade-off between speed and data obtained from tests by compressing in a time direction, using a built-in self tester (BIST), and still getting relevant data to the tester. The preferred systems method compress data in a time direction, but do not compress results from multiple primary data lines corresponding to respective I/O pads. Less I/O count is needed and the test time is reduced.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims. In general, the words "first," "second," etc., employed in the claims do not necessarily denote an order.

I claim:

1. A method of testing a memory in an integrated circuit (IC), the method comprising:
    providing an integrated circuit that includes a memory array, a self test circuit coupled to the memory array and a plurality of I/O pads coupled to the self test circuit;
    at the integrated circuit, receiving a test pattern from an external circuit through the I/O pads, the external circuit being external relative to the integrated circuit;
    writing the test pattern to a plurality of locations in the memory array in the integrated circuit;
    initializing a state in a latch within the self test circuit in the integrated circuit;
    subsequently, performing the following steps multiple times:
        changing a column address associated with a data line;
        reading from the data line;
        comparing a value read from the data line with a value based on the test pattern; and
        setting the state of the latch to a value depending upon the results of the comparing and the current value of the state; and
    after performing the steps multiple times, providing the contents of the latch from the integrated circuit to the external circuitry through the I/O pads.

2. The method of claim 1 further including selectively repairing the IC, depending on the state of the latch.

3. The method of claim 1 further including selectively connecting a word line of the IC, depending on the state of the latch.

4. The method of claim 1 wherein
    setting the state of the latch including performing a logical OR of the results of the comparing and the current value of the state.

5. The method of claim 1 further including changing a row address.

6. The method of claim 1 further including selectively connecting a plurality of word lines on the IC, depending on the state of the latch.

7. The method of claim 1 wherein each data line has a respective state.

8. The method of claim 1 wherein the IC includes a plurality of data lines and a plurality of states each associated with a respective one of the plurality of data lines and the method further includes the following steps, performed of each data line, of:
    initializing the state associated with the data line; and
    subsequently, performing the following steps multiple times:

changing a column address associated with a data line;
reading from the data line, comparing the read value to the first value, and setting the state to a value depending on the results of the comparing and the current value of the state.

9. The method of claim 8 further including selectively repairing the IC, depending on the states, without compressing the states together.

10. The method of claim 8 further including selectively connecting a word line on the IC, depending on the states.

11. The method of claim 8 including recording the states;
sending the recorded states off the IC, during subsequent executions of the changing, reading, comparing and setting steps.

12. The method of claim 8 wherein the number of states is S, and sending the recorded states includes sending using less than S I/O data pads to the IC.

13. An integrated circuit (IC) comprising:
a plurality of addressable memory locations arranged in rows and columns;
a row address decoder coupled to the memory locations to selectively activate rows of memory locations;
a column address decoder coupled to select ones of the rows;
a plurality of data lines, each data line coupled to a plurality of the columns and selectively responsive to one of multiple ones of the addressable locations within those columns as determined by the column address decoder;
a plurality of I/O pads associated with the plurality of data lines such that during a write or read cycle memory data is transferred to or from the data lines through the I/O pads;
a storage element that stores expected data with a first value;
a first element that stores a state; and
first circuitry, activatable multiple times after initialization of the element, that reads from the data line, compares the read value to the first value, and selectively modifies the state to a value depending on the results of the comparing and the current value of the state, the first circuitry being coupled to the I/O pads such that the value of the state can be transferred to external circuitry, the external circuitry being external relative to the integrated circuit.

14. The integrated circuit of claim 13 further including a redundant data line, selectively activatable depending on an output of the first circuitry.

15. The integrated circuit of claim 13 further including a redundant word line, selectively activatable depending on an output of the first circuitry.

16. The integrated circuit of claim 13 wherein the first circuitry includes logic that performs a logical OR operation.

17. The integrated circuit of claim 13 further including
a second element that stores the state, responsive to the first element, wherein the second element is coupled between the first circuitry and the I/O pads.

18. The integrated circuit of claim 13 wherein the plurality of data lines have a plurality of states each associated with a respective one of the plurality of data lines.

19. The integrated circuit of claim 18 further including a multiplexor coupled to the I/O pads to send data off of the IC, the multiplexor having an input responsive to the first circuitry.

20. A system including an integrated circuit (IC) comprising:
a plurality of addressable memory locations arranged in rows and columns;
a row address decoder coupled to the memory locations to selectively activate rows of memory locations;
a column address decoder coupled to select ones of the rows;
a plurality of data lines, each data line coupled to a plurality of the columns and selectively responsive to one of multiple ones of the addressable locations within those columns as determined by the column address decoder;
a plurality of I/O pads associated with the plurality of data lines such that during a write or read cycle memory data is transferred to or from the data lines through the I/O pads;
a storage element that stores expected data with a first value;
a first element that stores a state; and
first circuitry, activatable multiple times after initialization of the element, that reads from the data line, compares the read value to the first value, and selectively modifies the state to a value depending on the results of the comparing and the current value of the state, the first circuitry being coupled to the I/O pads such that the value of the state can be transferred to external circuitry, the external circuitry being external relative to the integrated circuit.

21. The system of claim 20 further including means for selectively repairing the IC, depending on the state.

22. The system of claim 20 further including means for selectively connecting a word line on the IC, depending on the state.

23. A method of testing a memory in an integrated circuit, the method comprising:
providing a memory array that includes a number of memory locations arranged in rows and columns, the rows being arranged in groups, each group being associated with a data line;
storing a first value in a plurality of the memory locations;
initializing a latch to indicate a passing state;
performing a plurality of latch cycles, each latch cycle including:
a) performing a plurality of memory cycles, each memory cycle including:
i) reading one of the memory locations associated with each of the data lines;
ii) comparing the read value to the first value;
iii) if the read value did not match the first value, setting the latch to indicate a failing state;
b) after performing a plurality of memory cycles, providing the state of the latch to a read-out latch.

24. The method of claim 23 further including selectively repairing the IC, depending on the state of the latch.

25. The method of claim 23 further including selectively connecting a word line of the IC, depending on the state of the latch.

26. The method of claim 23 wherein setting the latch to indicate a failing state includes performing a logical OR of the results of the comparing and the current value of the state.

27. The method of claim 23 further including changing a row address.

* * * * *